US006970361B2

(12) United States Patent
Jansen

(10) Patent No.: US 6,970,361 B2
(45) Date of Patent: Nov. 29, 2005

(54) SYSTEM AND METHOD FOR PIVOTAL INSTALLATION AND REMOVAL OF A CIRCUIT BOARD FROM A CHASSIS

(75) Inventor: Kenneth A. Jansen, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/695,202

(22) Filed: Oct. 28, 2003

(65) Prior Publication Data

US 2005/0024836 A1 Feb. 3, 2005

Related U.S. Application Data

(63) Continuation of application No. 10/041,010, filed on Jan. 7, 2002, now Pat. No. 6,667,889.

(51) Int. Cl.[7] .............................. H05K 5/00; H05K 5/04
(52) U.S. Cl. ...................... 361/759; 361/683; 361/686; 439/377
(58) Field of Search ................................ 361/759–760, 361/801, 730, 752, 797, 756, 800, 683, 686; 439/377, 326

(56) References Cited

U.S. PATENT DOCUMENTS

| 5,337,220 | A | 8/1994 | Granitz |
| 5,572,402 | A | 11/1996 | Jeong |
| 6,233,154 | B1 * | 5/2001 | Farnworth et al. .......... 361/752 |
| 6,234,820 | B1 | 5/2001 | Perino et al. |
| 6,282,099 | B1 | 8/2001 | Wilson et al. |
| 6,493,033 | B1 | 12/2002 | Glogan et al. |
| 6,710,614 | B1 * | 3/2004 | Wark ......................... 324/761 |

* cited by examiner

*Primary Examiner*—Kamand Cuneo
*Assistant Examiner*—Hung S. Bui

(57) ABSTRACT

A multi-sectional computing device configurable for a plurality of computing worlds, including portable and desktop computing worlds. The technique includes a space saving and configuration technique utilizing multiple joints disposed between multiple sections to facilitate rotational orientation of the sections to adjust for space limitations and other characteristics of a desired environment or computing world. The multiple sections include a display assembly and a housing assembly for computing components.

16 Claims, 7 Drawing Sheets

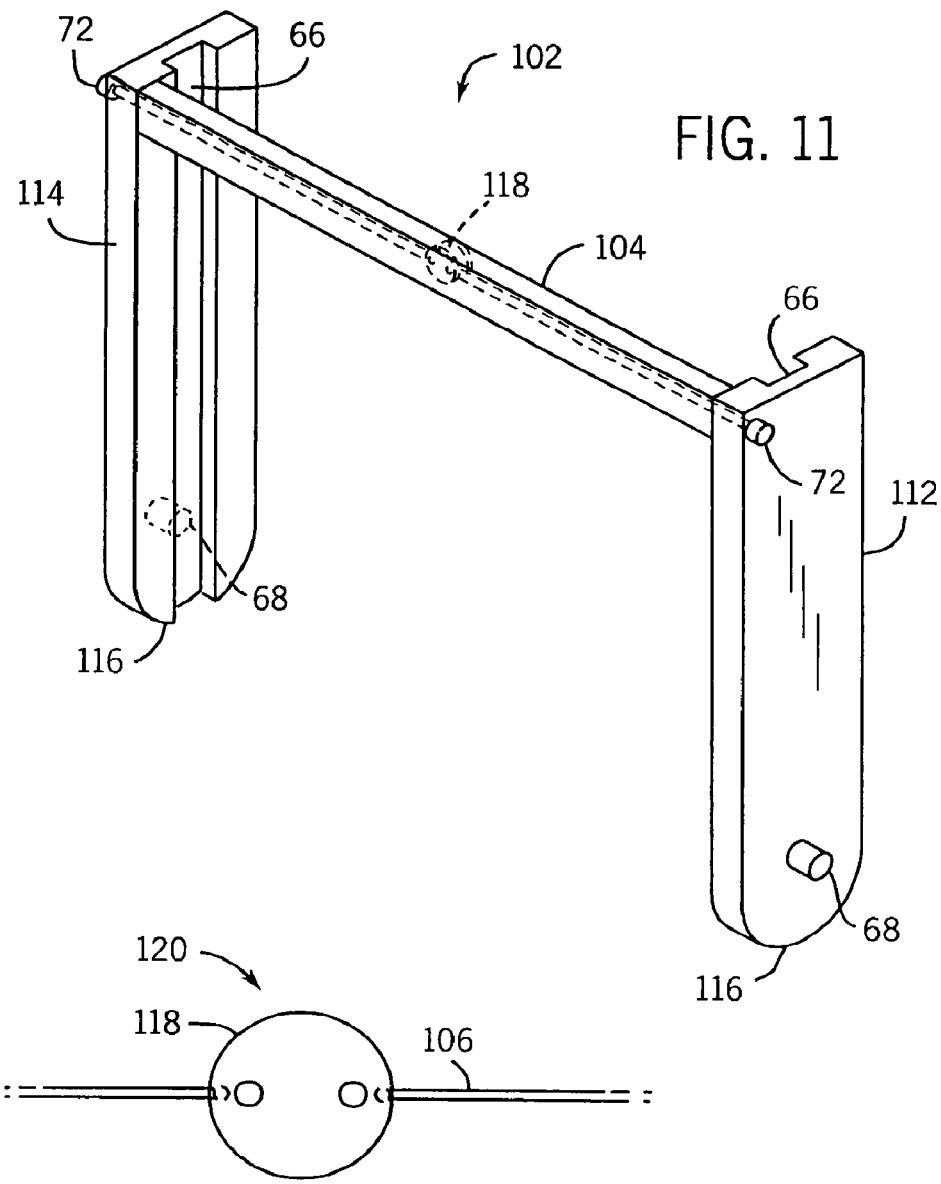
FIG. 11
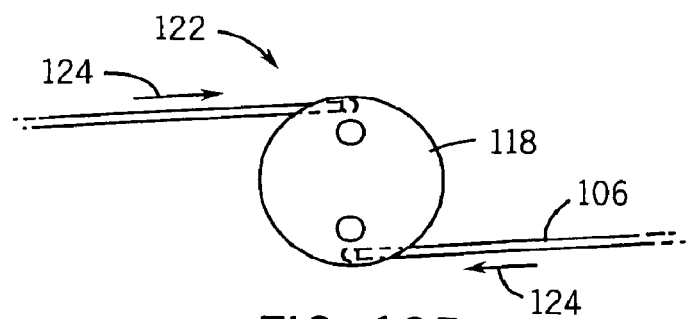
FIG. 12A
FIG. 12B

SYSTEM AND METHOD FOR PIVOTAL INSTALLATION AND REMOVAL OF A CIRCUIT BOARD FROM A CHASSIS

CROSS REFERENCE TO RELATED APPLICATION(s);

This is a continuation of application Ser. No. 10/041,010 filed on Jan. 7, 2002, now U.S. Pat. No. 6,667,889 which is hereby incorporated by reference herein.

FIELD OF THE INVENTION

The present invention relates generally to a system and method for installing printed circuit boards into an electronic device, and particularly to a device for guiding and retaining a printed circuit board in an electronic device.

BACKGROUND OF THE INVENTION

Printed circuit boards, otherwise known as boards or cards, serve as a basic framework for assembling electrical components into a useful electronic device. In a typical electronic device, electronic components are mounted onto a surface of the board. Metal lead wires from the component are then soldered to conductive traces on the board. Soldering the leads to the board serves two purposes: first, it secures the electronic component to the printed circuit board and, second, it ensures a good electrical connection between the electronic component and the conductive path.

In many electronic devices, such as computers, the electronic components are mounted onto several printed circuit boards. For the electronic components to perform their desired function, each of the boards must be electrically coupled to other elements of the electrical system of the device. Typically, a printed circuit board contains an electrical connector that is configured to matingly engage a corresponding electrical connector within the device. When mated, the electrical connectors create conductive paths between the two electrical connectors. Typically, electrical connectors are configured in a male-female configuration, i.e., a male connector is physically inserted into a female connector.

Circuit boards are installed in electronic systems in a variety of orientations. The selected orientation may be based on a number of factors, including physical constraints required by the device and the intended function of the circuit board. The physical constraints of the device also may make removal and installation of the circuit board difficult and/or time consuming. For example, many electronic devices, such as servers, are typically mounted in vertical rack-mounted systems. The device would have to be removed from the rack-mounted system to access the device from the top or the bottom. This gets increasingly difficult as the weight and the height of the device in the rack increases.

Servers typically utilize a mid-plane board that is vertically mounted within a chassis. The mid-plane board is used to electrically couple electronic devices and/or other circuit boards located on the same and opposite sides of the mid-plane board. Typically, the server must be removed from the rack if the mid-plane board is to be removed from the server or installed therein. Those components of the server that may be removed while the server is still mounted in the rack are removed to make the server lighter for easier removal from the rack. The server is then removed from the rack and the mid-plane board is accessed via the top of the chassis. The process is repeated in reverse order to replace the mid-plane board in the server and to reinstall the server in the rack. The process of removing and reinstalling the mid-plane board is time-consuming.

Therefore, it would be advantageous to have an apparatus that would enable a circuit board to be more easily removed from and replaced in a chassis. This is especially true for circuit boards that are vertically mounted within a chassis and are to be removed from the front or rear of the chassis.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

According to one aspect of the present invention, a circuit board holder is featured. The circuit board holder has a receiving portion that is adapted to receive a circuit board. The circuit board holder also has a pivoting portion that enables the circuit board to pivot relative to a chassis. Additionally, the circuit board holder has a securing portion that enables the circuit board to be selectively secured to the chassis.

According to another aspect of the present invention, an electronic device is featured. The electronic device has a chassis and a circuit board holder. The circuit board holder is pivotably secured to the chassis. Additionally, the circuit board holder is operable to secure the circuit board in a first position relative to the chassis. The circuit board holder also is operable to pivot the circuit board from the first position to a second position relative to the chassis.

BRIEF DESCRIPTION OF THE DRAWINGS

The invention will hereafter be described with reference to the accompanying drawings, wherein like reference numerals denote like elements, and:

FIG. 11 is a perspective view of a second alternative embodiment of a pivotable circuit board holder;

FIG. 12A is a diagrammatical representation of a rotatable operator oriented in a first position; and FIG. 12B is a diagrammatical representation of the rotatable operator of FIG. 12A oriented in a second position.

DETAILED DESCRIPTION OF THE PREFERRED EMBODIMENT

Figure 1:
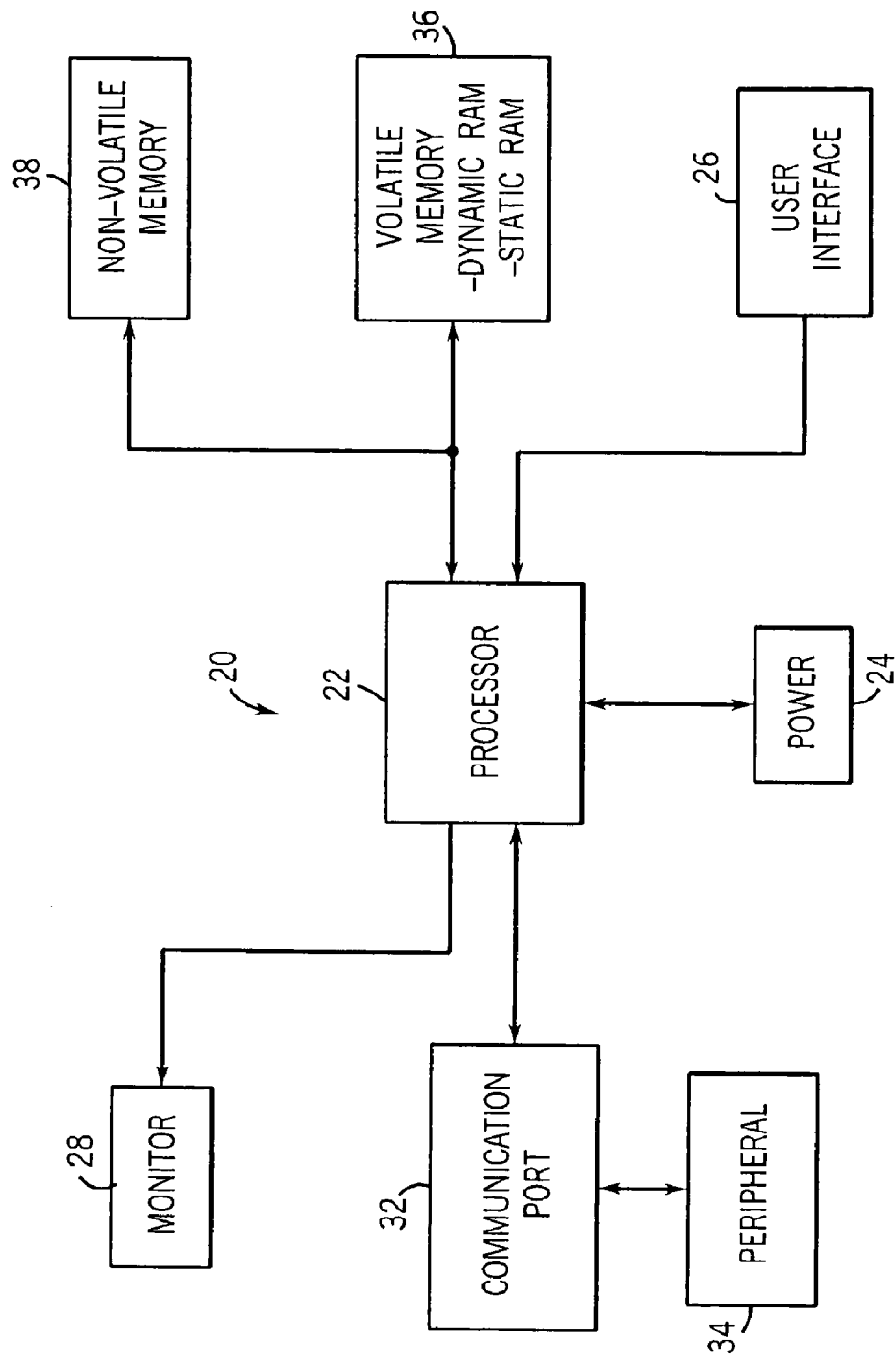
FIG. 1 is a block diagram of a processor-based device.

Referring generally to FIG. 1, a block diagram is illustrated depicting an exemplary processor-based device, generally designated by the reference numeral 20. The processor-based device 20 may be any of a variety of different devices, such as a personal computer or a server.

The illustrated processor-based device 20 uses a processor 22 to control the operation of the device 20. The processor 22 may be a microprocessor, such as used in a personal computer, or other type of processor. The illustrated processor-based device 20 has a power supply 24 to supply power to the other components of the system. Various additional components of system 20 may be coupled to the processor 22. For instance, a user interface 26 may be coupled to the processor 22 to allow an operator to control some or all of the functions of the device. Examples of user interfaces include a keyboard, a mouse, or a joystick. A monitor 28 may be coupled to the processor 22 to allow an operator to view visual information provided by the device. This information may be displayed on the monitor via a graphical user interface. A communications port 32 may also be used to couple processor 22 to peripheral devices 34, such as a modem or printer.

Programming instructions are typically used to control the operation of a processor and these programming instructions are typically stored in electronic memory. There are several different types of electronic memory available for use in processor-based devices. For example, the processor 22 may be coupled to volatile memory 36. Volatile memory may include dynamic random access memory (DRAM) and/or static random access memory (SRAM). The processor 22 also may be coupled to non-volatile memory 38. Non-volatile memory 38 may include a read only memory (ROM), such as an EPROM, to be used in conjunction with the volatile memory. The non-volatile memory 38 may include a high capacity memory such as a disk or tape drive memory.

Figure 2:
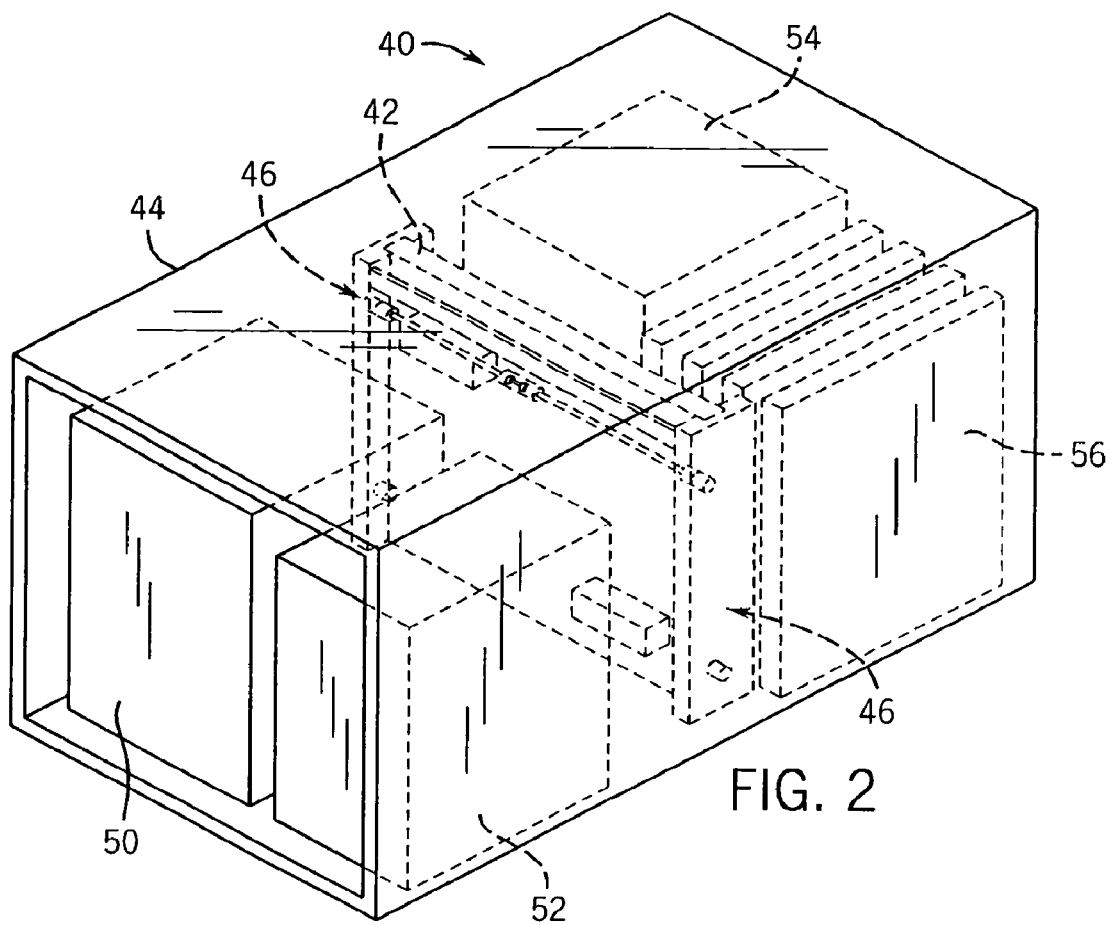
FIG. 2 is a perspective view of an electronic device utilizing a vertically mounted circuit board, according to an exemplary embodiment of the present technique.

Referring generally to FIG. 2, an electronic device 40 having a circuit board 42 mounted vertically within a chassis 44 is illustrated. A pivotable circuit board holder 46 mounts the circuit board 42 to the chassis 44. In the illustrated embodiment, the circuit board 42 is mounted approximately in the middle of the chassis 44. However, the circuit board 42 may be mounted in another portion of the chassis 44, such as the front or rear.

Figure 3:
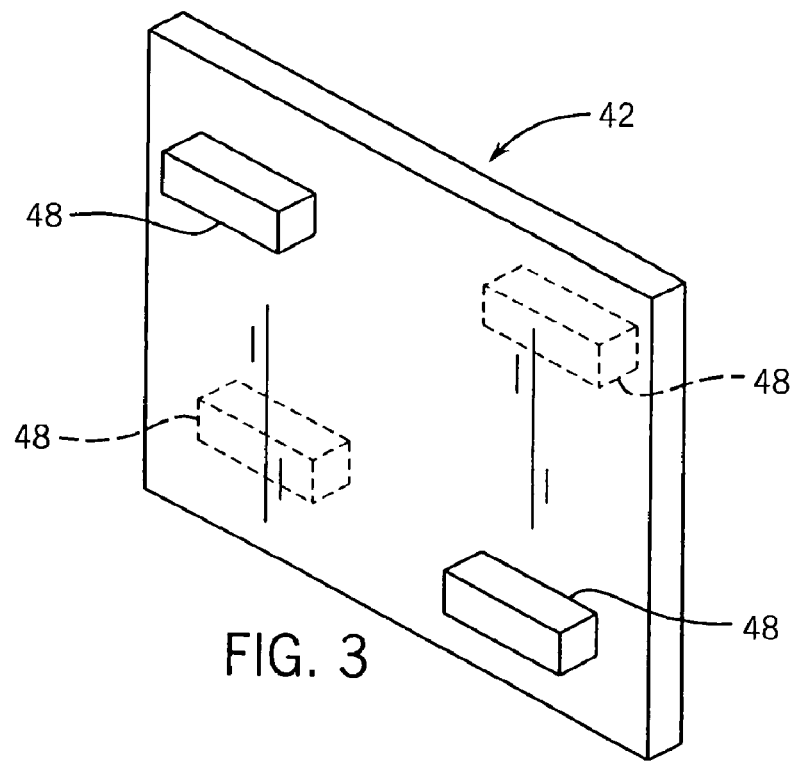
FIG. 3 is a perspective view of the vertically mounted circuit board of FIG. 2.

As best illustrated in FIG. 3, an exemplary embodiment of circuit board 42 has a number of electrical connectors 48 disposed on each side of the circuit board 42. These electrical connectors 48 are adapted to engage corresponding electrical connectors (not shown) on other components of the device 40 to electrically couple these components to the circuit board and, thus, to other components of the device 40.

Referring again to FIG. 2, a number of components are connected to the circuit board 42 in the illustrated embodiment. For example, in this embodiment, a processor module 50 and a memory module 52 are connected to connectors 48 on one side of the circuit board 42. The processor module 50 houses one or more processors (not shown). The memory module 52 houses memory, such as a hard drive or RAM. Additionally, a fan module 54 and a plurality of input/output modules 56 are connected to connectors 48 on the opposite side of the circuit board 42. The fan module provides a flow of air to cool the device 40. The input/output modules 56 enable the device 40 to communicate with other electronic devices.

Figure 4:
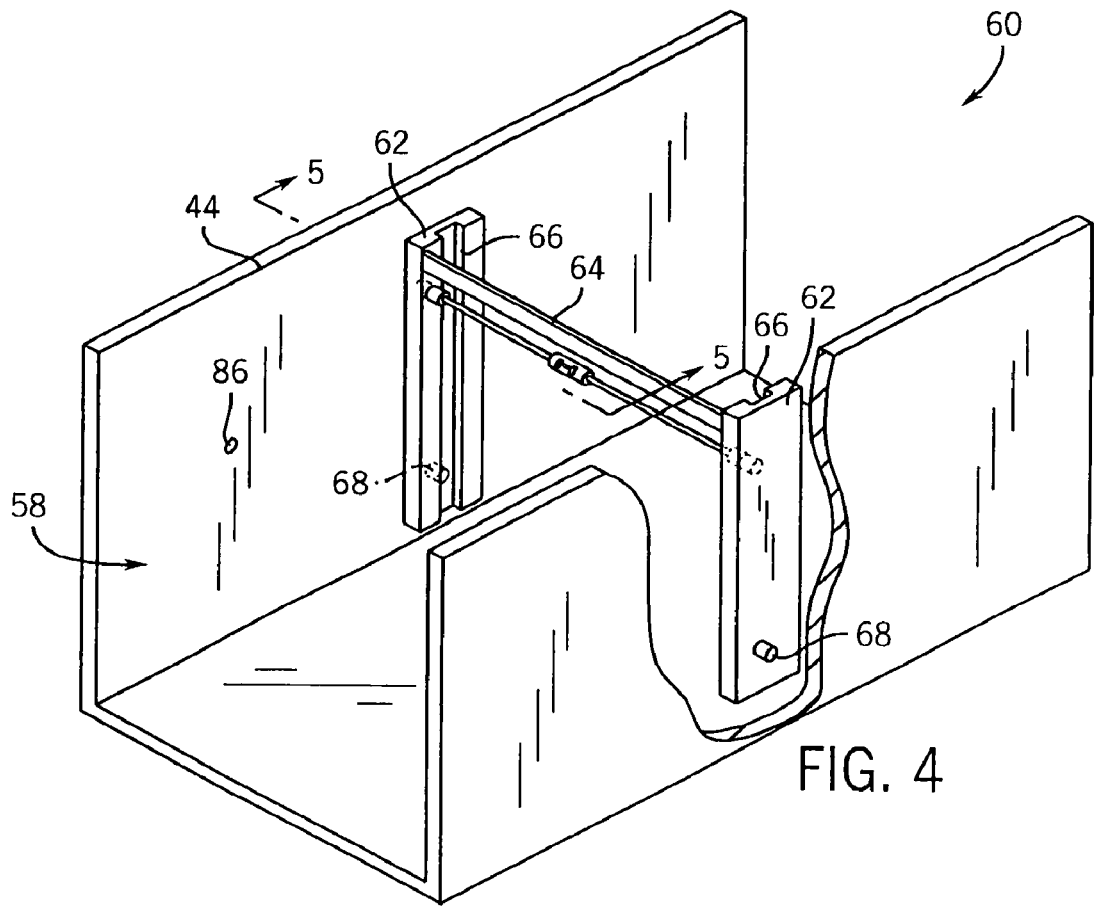
FIG. 4 is a cut-away view of a portion of the electronic device of FIG. 2, illustrating a pivotable circuit board holder in a secured position, according to an exemplary embodiment of the present technique.
Figure 5:
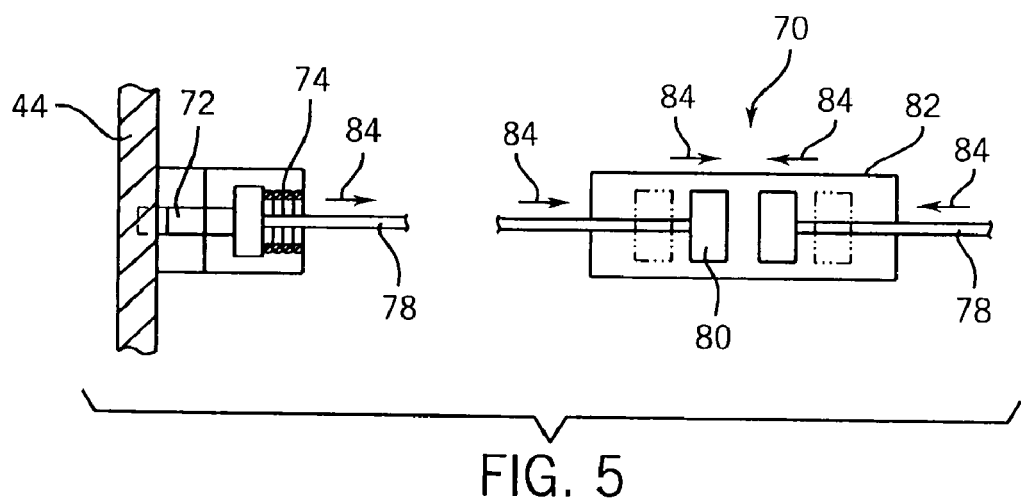
FIG. 5 is a cross-sectional view of a portion of the chassis and pivotable circuit board holder, according to an exemplary embodiment of the present technique.
Figure 6:
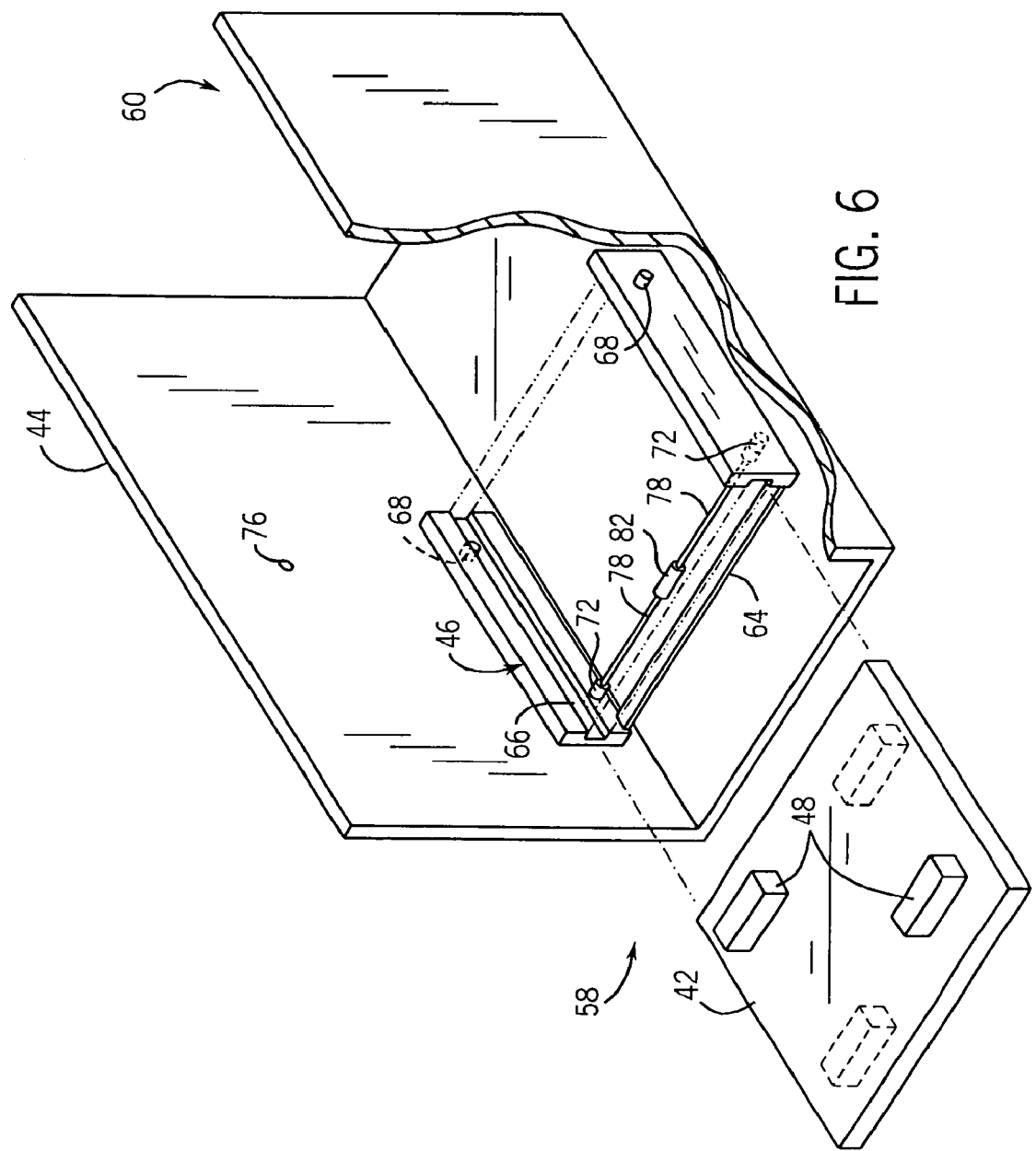
FIG. 6 is a cut-away view of a portion of the electronic device of FIG. 2, illustrating the pivotable circuit board holder in a pivoted position, according to an exemplary embodiment of the present technique.

Referring generally to FIGS. 4–6, the pivotable circuit board holder 46 is pivotable to enable the circuit board 42 to be removed or installed from the front 58 or rear 60 of the device 40. The illustrated pivot able circuit board holder 46 has two guide portions 62 connected by a crossbar 64. Each guide portion 62 has a slot 66 for guiding and securing the circuit board 42 within the chassis 44. Additionally, each guide portion 62 has a pivoting pin 68. The pivotable circuit board holder 46 also has a securing assembly 70 that is operable to fix the pivotable circuit board holder 46 in a vertical position, as illustrated in FIG. 4, or allow the pivotable circuit board holder 46 to pivot to a horizontal position, as illustrated in FIG. 6.

When the pivotable circuit board holder 46 is fixed in the vertical position, a retractable pin 72 in each guide portion 62 is biased by a spring 74 into a portion of the chassis 44, or some other fixed surface within the chassis 44. Each retractable pin 72 is coupled by a connector 78 to a movable operator 80. The connector 78 may be a rigid member or a flexible wire. In the illustrated embodiment, the operators 80 are disposed within a housing 82 to guide the movement of the operators 80. To release the pivotable circuit board holder 46 from the vertical position, the operators 80 are squeezed together, as represented by the arrows 84. The inward movement of the operators 80 is coupled to the retractable pins 72, removing them from the portions 76 of the chassis 44 and compressing the springs 74. The pivotable circuit board holder 46 is now free to pivot about the pivoting pins 68.

The circuit board 42 then may be removed or installed from the front 58 of the chassis 44, as illustrated in FIG. 6, or from the rear 60 of the chassis 44 (not shown). To secure the pivotable circuit board holder 46 in the vertical position, the pivotable circuit board holder 46 is pivoted upright so that the retractable pins 72 may be driven by the springs 74 back into the securing portion 76 of the chassis 44. The securing assembly 70 may also include second securing portions 86 that are positioned to secure the retractable pins 72 in a second position to enable the circuit board 42 to be removed from the circuit board holder 46 more easily.

Figure 7:
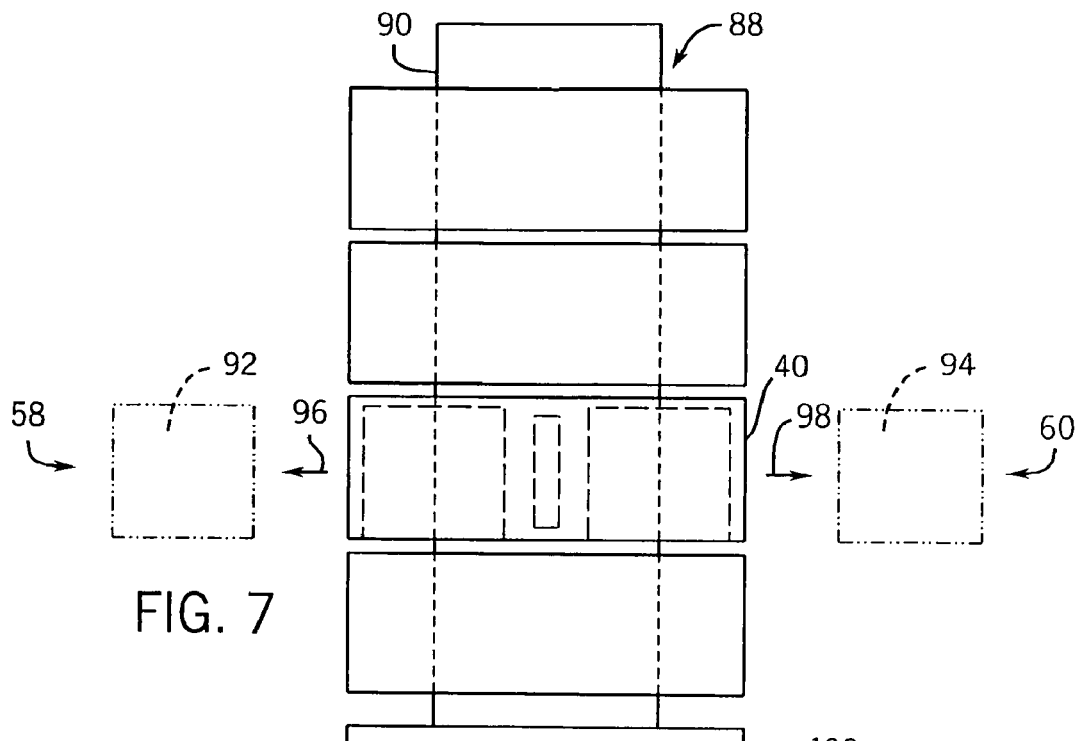
FIG. 7 is a side elevational view of a rack-mounted system, according to an exemplary embodiment of the present technique.

Referring generally to FIG. 7, a rack-mounted electronic system 88 is illustrated. In this embodiment, the electronic device 40 is adapted to secure to a rack 90. Access to the circuit board 42 from the top of the device 40 is blocked by other components of the system 88. To remove the circuit board 42 from the chassis 44, components 92 that engage the circuit board 42 are disengaged to enable the circuit board 42 to pivot. Components 92 located on the front portion of the chassis 44 may be accessed from the front side 58 and components 94 located on the rear portion of the chassis 44 may be accessed from the rear side 60.

Additionally, those components located on the side of the chassis from which the circuit board is to be removed are removed from the chassis 44 to enable access to the circuit board holder 46 and circuit board 42. For example, if the circuit board 42 is to be removed from the front side 58, the components 92 located on the front portion of the chassis 44 are removed from the chassis 44, as represented by the arrow 96. Alternatively, if the circuit board 42 is to be removed from the rear side 60, the components 94 located on the rear portion of the chassis 44 are removed from the chassis 44, as represented by the arrow 98.

Figure 8:
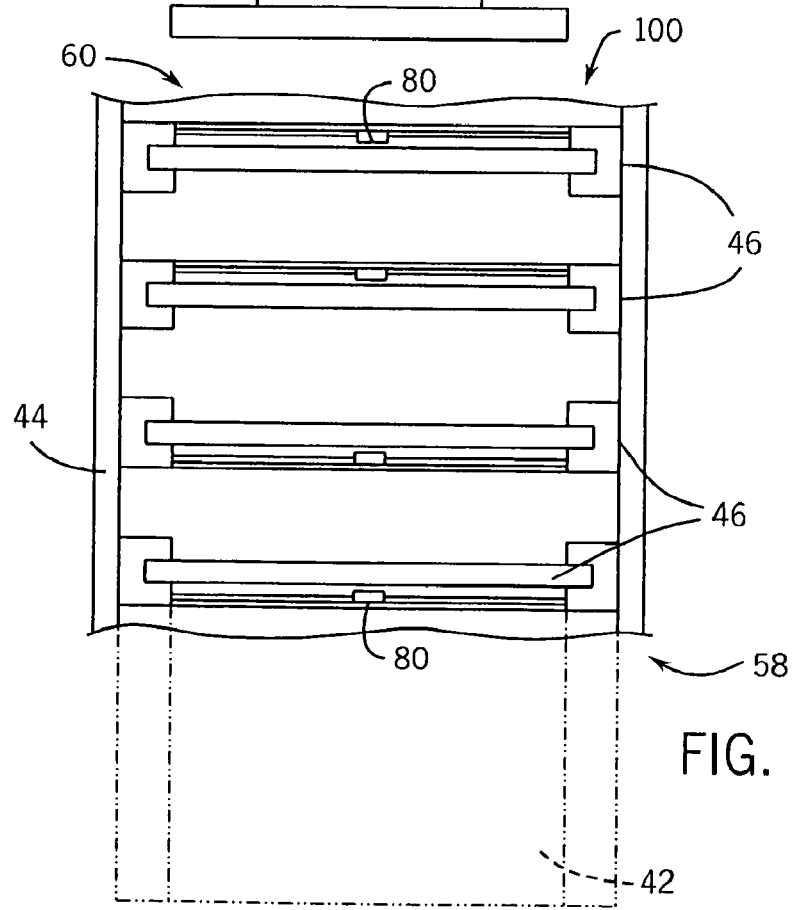
FIG. 8 is a top view of an alternative embodiment of an electronic device, illustrating a plurality of circuit boards secured within pivotable circuit board holders.

An alternative embodiment of an electronic device 100 also is illustrated in FIG. 8. In this embodiment, a plurality of circuit boards 42 and pivotable circuit board holders 46 are disposed within a chassis 44, some oriented for the circuit boards 42 to be removed from the front 58 and some oriented for the circuit boards 42 to be removed from the rear 60.

Figure 9:
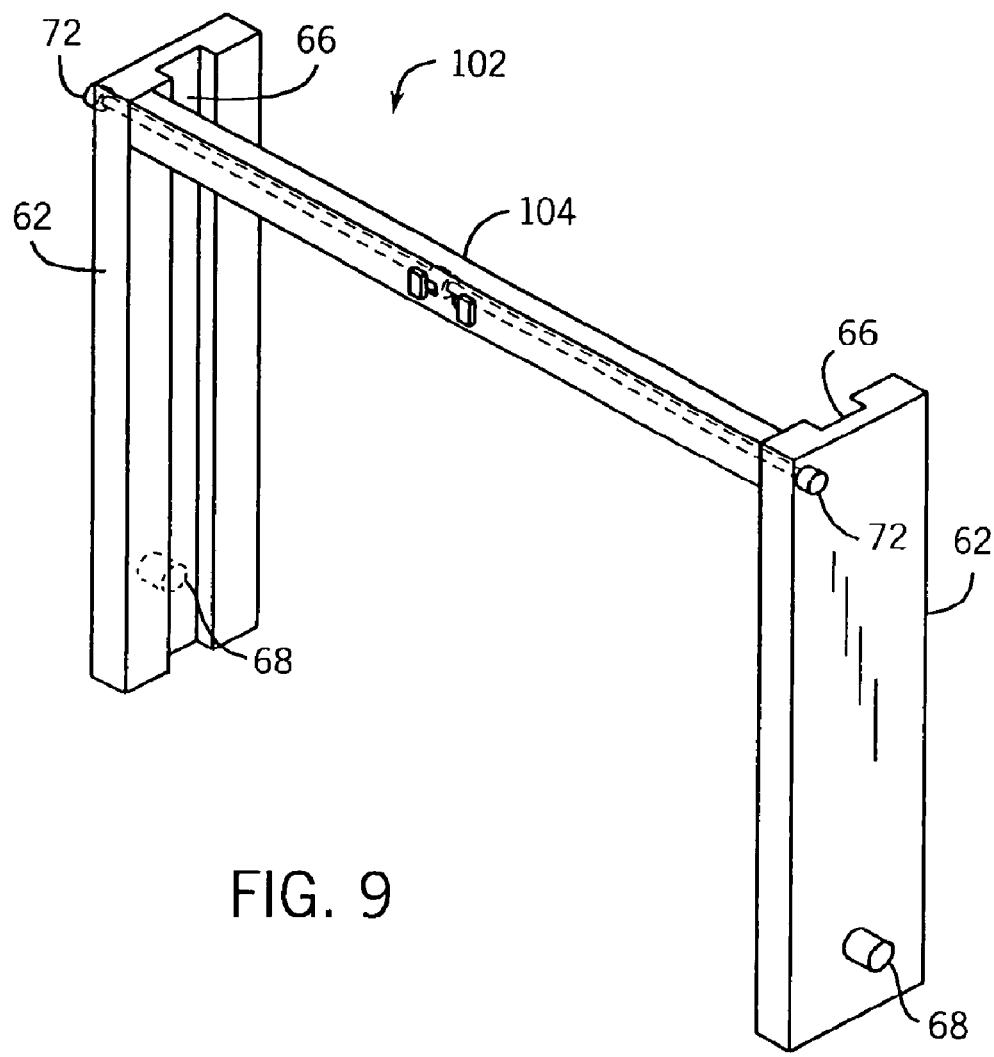
FIG. 9 is a perspective view of an alternative embodiment of a pivotable circuit board holder.
Figure 10:
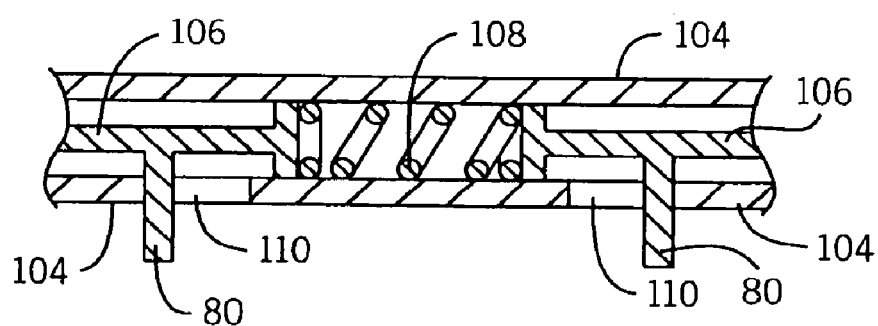
FIG. 10 is a cross-sectional view of a portion of the pivotable circuit board holder of FIG. 8.

Additionally, an alternative embodiment of a pivotable circuit board holder 102 is illustrated in FIGS. 9 and 10. In the illustrated embodiment, the guide portions 62 are joined by a cross-member 104. The cross-member 104 houses connector rods 106 coupled to the retractable pins 72. A single biasing spring 108 is used to drive the connector rods 106 outward to bias the retractable pins 72 into an engaged position within securing portions 76 of the chassis 44. Guide slots 110 in the cross-member 104 direct movement of the operators 80.

Referring generally to FIGS. 11 and 12, an additional alternative embodiment of a pivotable circuit board holder 112 is illustrated. In this embodiment, the guide portions 114 have a curved bottom 116. The curved bottom 106 enables the guide portions 114 to extend closer to the bottom of the chassis without interfering with the pivoting motion of the pivotable circuit board holder 112. In addition, the pivotable circuit board holder 112 has a rotatable operator 118. The rotatable operator 118 is coupled to the connector rods 106 so that the connector rods 106 are displaced laterally as the operator 118 is rotated.

As illustrated in FIG. 12A, the connector rods 106 are positioned to drive the pins 72 into socket 76 in a first position 120 of the operator 118. The operator 118 may be rotated to a second position 122, as illustrated in FIG. 12B. In the second position 122, the connector rods 106 are drawn inward, as represented by the arrows 124, thereby removing the pins 72 from sockets 76, and enabling the pivotable circuit board holder 112 to pivot. Rotating the operator 118 back to the first position 120 drives the pins 72 outward. A spring (not shown) may be coupled to the rotatable operator 118 to bias the operator 118 to drive the pins 72 into socket 76.

It will be understood that the foregoing description is of preferred exemplary embodiments of this invention, and that the invention is not limited to the specific forms shown. For example, the pivotable circuit board holder is not limited to securing circuit boards vertically within a chassis and enabling them to be removed from the front of a chassis. Rather, the pivotable circuit board may be used to secure a circuit board in a number of orientations other than vertical, such as the horizontal position or an intermediate position between the two. Similarly, the pivotable circuit board holder may be pivoted to a number of orientations, other than horizontal, to enable the circuit board to be removed. These and other modifications may be made in the design and arrangement of the elements without departing from the scope of the invention as expressed in the appended claims.

What is claimed is:

1. A server, comprising:
   a mid-plane circuit board comprising a first electrical connector disposed on a first side of the mid-plane circuit board and a second electrical connector disposed on a second side of the mid-plane circuit board opposite the first side of the mid-plane circuit board;
   a chassis having either or both of a front opening or a rear opening;
   a board holder operable to receive the mid-plane circuit board, wherein the board holder is operable to be pivoted into a first position relative to the chassis to enable the mid-plane circuit board to be disposed within or removed from the board holder via the front opening or the rear opening and operable to be pivoted into a second position relative to the chassis to enable electrical components to be respectively coupled to the first electrical connector and the second electrical connector; and
   a securing member operable to selectively secure the board holder to prevent pivotal movement of the mid-plane circuit board relative to the chassis.

2. The server as recited in claim 1, wherein the securing member is operable to secure the mid-plane circuit board generally vertically in the second position.

3. The server as recited in claim 2, wherein the securing member is operable to release the pivotal board holder to enable the mid-plane circuit board to be pivoted generally horizontally to the first position.

4. The server as recited in claim 1, wherein the board holder is fully disposed within the chassis during operation.

5. The server as recited in claim 1, comprising at least one first component coupled to the first electrical connector and at least one second component coupled to the second electrical connector.

6. The server as recited in claim 1, comprising a processor assembly connectable to the first electrical connector.

7. The server as recited in claim 1, comprising an input/output device connectable to the second electrical connector.

8. The server as recited in claim 1, wherein the mid-plane circuit board comprises a third electrical connector disposed on the first side of the mid-plane circuit board, and wherein the server comprises a memory storage device connectable to the third electrical connector.

9. A method of coupling a mid-plane circuit board to a chassis of a server, comprising:
   inserting the mid-plane circuit board into a circuit board holder through a side of the chassis;
   rotating the circuit board holder into a first position such that the mid-plane circuit board is coupleable to a first electrical component on a first side of the mid-plane circuit board and a second electrical component on a second side of the mid-plane circuit board opposite the first side of the mid-plane circuit board; and
   securing the mid-plane circuit board and the circuit board holder in the first position.

10. The method as recited in claim 9, comprising connecting the first electrical component to an electrical connector disposed on the first side of the mid-plane circuit board and connecting the second electrical component to an electrical connector disposed on the second side of the mid-plane circuit board.

11. The method as recited in claim 9, wherein the act of securing comprises:
   operating a circuit board holder securing device to release the circuit board holder for pivoting relative to the chassis; and
   pivoting the circuit board holder from a first position to a second position.

12. The method as recited in claim 10, wherein connecting the first electrical component to the electrical connector disposed on the first side of the mid-plane circuit board comprises connecting a data storage assembly to the mid-plane circuit board.

13. The method as recited in claim 11, wherein pivoting the circuit board holder comprises pivoting the circuit board holder toward a front side of the server.

14. The method as recited in claim 13, wherein inserting the mid-plane circuit board into the circuit board holder through the side of the server comprises inserting the mid-plane circuit board through the front side of the server.

15. The method as recited in claim 11, wherein pivoting the circuit board holder comprises pivoting the circuit board holder toward a rear side of the server.

16. The method as recited in claim 15, wherein inserting the mid-plane circuit board into the circuit board holder through the side of the server comprises inserting the circuit board through the rear side of the server.

* * * * *